(12) United States Patent
Cheng et al.

(10) Patent No.: US 9,583,465 B1
(45) Date of Patent: Feb. 28, 2017

(54) THREE DIMENSIONAL INTEGRATED CIRCUIT STRUCTURE AND MANUFACTURING METHOD OF THE SAME

(71) Applicant: Taiwan Semiconductor Manufacturing Co., Ltd., Hsin-Chu (TW)

(72) Inventors: Kuang-Wei Cheng, Hsinchu (TW); Yi-Hsiu Chen, Hsinchu (TW); Ku-Feng Yang, Hsinchu County (TW); Wen-Chih Chiou, Miaoli County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/840,053

(22) Filed: Aug. 31, 2015

(51) Int. Cl.
*H01L 23/00* (2006.01)
*H01L 25/07* (2006.01)
*H01L 23/538* (2006.01)
*H01L 25/00* (2006.01)
*H01L 21/48* (2006.01)
*H01L 23/522* (2006.01)

(52) U.S. Cl.
CPC ........ *H01L 25/074* (2013.01); *H01L 23/5384* (2013.01); *H01L 23/5386* (2013.01); *H01L 25/50* (2013.01); *H01L 21/48* (2013.01); *H01L 23/522* (2013.01)

(58) Field of Classification Search
CPC ..................................................... H01L 25/074
See application file for complete search history.

(56) References Cited

U.S. PATENT DOCUMENTS

| | | | |
|---|---|---|---|
| 2007/0045836 A1* | 3/2007 | Kwon | H01L 21/76898 257/734 |
| 2007/0096263 A1* | 5/2007 | Furukawa | H01L 21/76898 257/621 |
| 2007/0171582 A1* | 7/2007 | Lin | H02M 3/33561 361/18 |

\* cited by examiner

*Primary Examiner* — William Harriston
(74) *Attorney, Agent, or Firm* — Jianq Chyun IP Office

(57) ABSTRACT

Three dimensional integrated circuit structures and manufacturing methods of the same are disclosed. The three dimensional integrated circuit structure includes a first chip and a second chip. The first chip is bonded to the second chip at a bonding interface. A through via of the first chip and a bonding pad of the second chip are electrically connected, and a diffusion barrier layer of the through via contacts the bonding pad at the bonding interface.

18 Claims, 14 Drawing Sheets

THREE DIMENSIONAL INTEGRATED CIRCUIT STRUCTURE AND MANUFACTURING METHOD OF THE SAME

BACKGROUND

The semiconductor industry continues to improve the integration density of various electronic components (e.g., transistors, diodes, resistors, capacitors, etc.) by continual reductions in minimum feature size. This allows more components to be integrated into a given area. In some applications, these smaller electronic components also require smaller packages that utilize less area than conventional packages.

Three dimensional integrated circuits (3DICs) are a recent development in semiconductor packaging in which multiple semiconductor dies are stacked upon one another, such as package-on-package (PoP) and system-in-package (SiP) packaging techniques. Some 3DICs are prepared by placing dies over dies on a semiconductor wafer level. The 3DICs have, for example, decreased length of interconnects between the stacked dies, and thus provide improved integration density and other advantages, such as faster speeds and higher bandwidth. However, there are many challenges related to 3DICs.

BRIEF DESCRIPTION OF THE DRAWINGS

FIG. 2A through FIG. 2J are schematic views showing a manufacturing method of a three dimensional integrated circuit structure in accordance with some embodiments.

DETAILED DESCRIPTION

Figure 1:
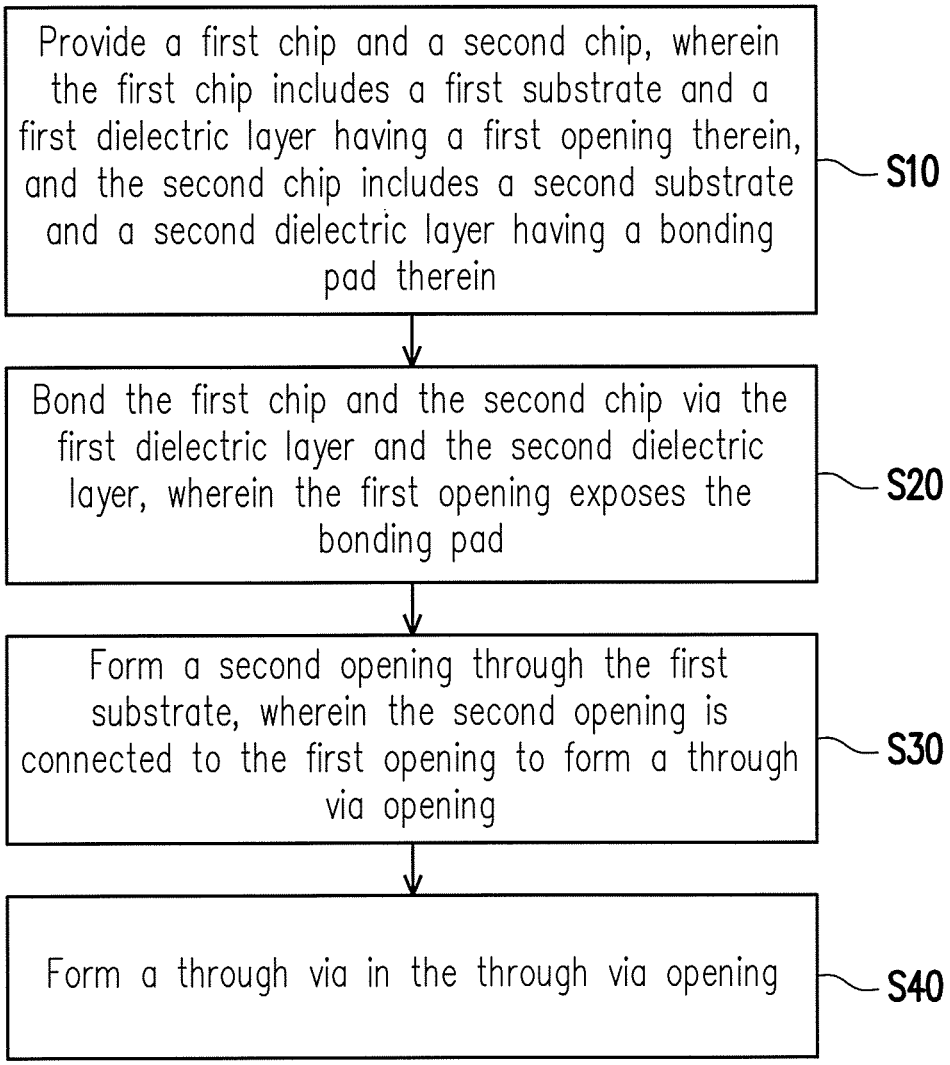
FIG. 1 is a flowchart showing a manufacturing method of a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart showing a manufacturing method of a three dimensional integrated circuit structure in accordance with some embodiments. FIG. 2A through FIG. 2J are schematic views showing a manufacturing method of a three dimensional integrated circuit structure in accordance with some embodiments.

Figure 2A:
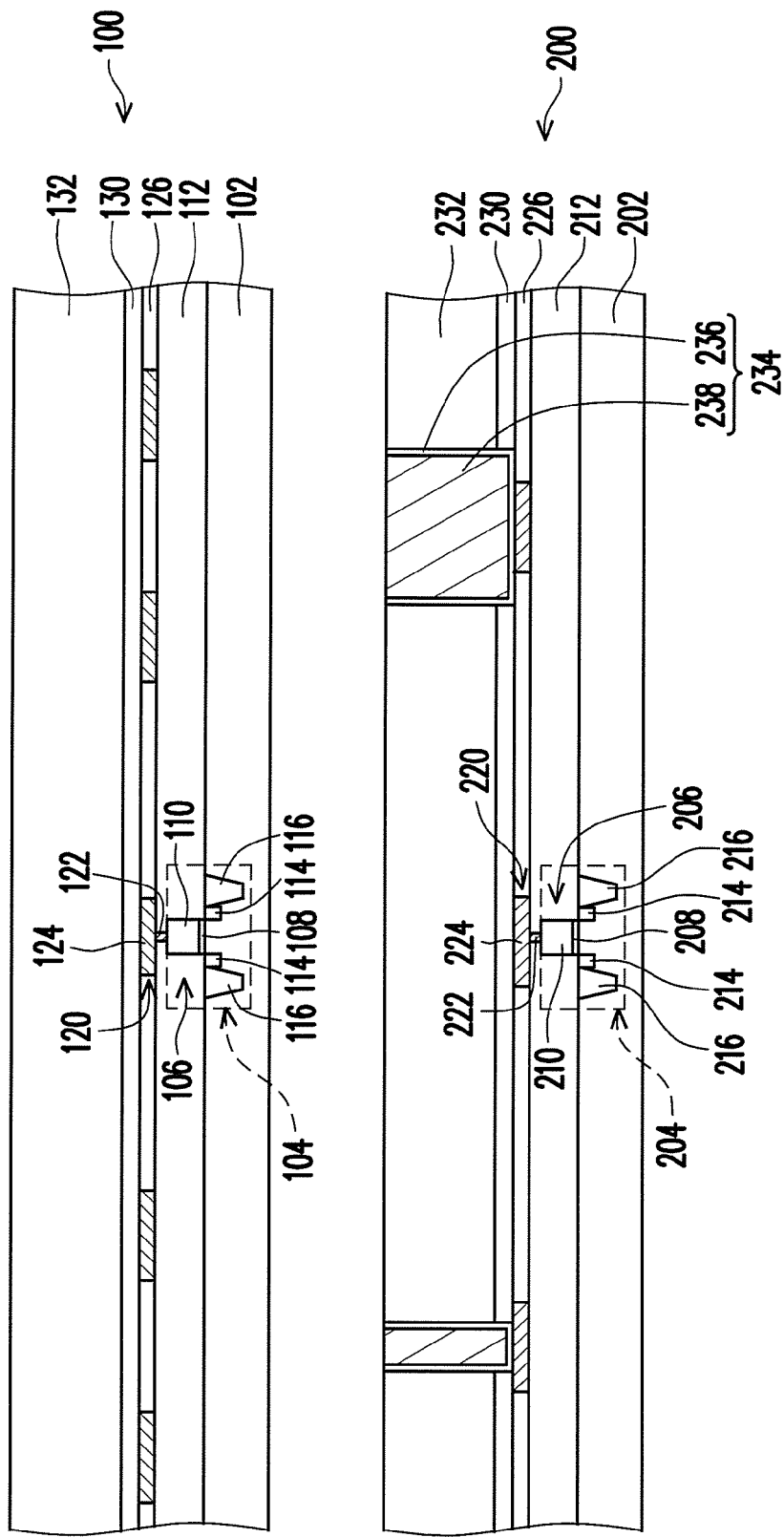

Referring to FIG. 1, in Step S10, a first chip 100 and a second chip 200 are provided. Referring to FIG. 2A, the first chip 100 includes a first substrate 102 and a dielectric layer 132. In some embodiments, the first substrate 102 includes an elementary semiconductor such as silicon or germanium and/or a compound semiconductor such as silicon germanium, silicon carbide, gallium arsenic, indium arsenide, gallium nitride or indium phosphide.

The first chip 100 further includes a device 104, a metallization structure 120 and a dielectric layer 130. The device 104 is formed in a front-end-of-line (FEOL) process, but is not limited thereto. The device 104 includes, for example, a gate structure 106 in a dielectric layer 112, source/drain regions 114, and isolation structures 116, where the isolation structures 116 may be shallow trench isolation (STI) structures. The gate structure 106 includes, for example, a gate dielectric layer 108 and a gate electrode 110. In alternative embodiments, the gate structure 106 may further include spacers (not shown) on the gate electrode 110.

In some embodiments, the device 104 may be an N-type metal-oxide semiconductor (NMOS) or a P-type metal-oxide semiconductor (PMOS) device, such as a transistor, a memory, etc. In alternative embodiments, a capacitor, a resistor, a diode, a photo-diode, a fuse, or the like may also be formed over the first substrate 102.

In some embodiments, the metallization structure 120 is formed over the first substrate 102. For example, the metallization structure 120 may be formed over the device 104. In some embodiments, the metallization structure 120 may be formed in a back-end-of-line (BEOL) process, but is not limited thereto. The metallization structure 120 includes an interconnect structure, such as a contact plug 122 and a conductive feature 124. In some embodiments, the conductive feature 124 is in a dielectric layer 126, and the conductive feature 124 may be a conductive line, a conductive layer or the like. In some embodiments, the dielectric layer 126 includes a single dielectric layer or multiple dielectric layers. The dielectric layer 126 includes, for example, a low dielectric constant (low-k) material such as silicon oxide ($SiO_2$), silicon nitride ($SiN_x$), etc.

In some embodiments, the dielectric layer 130 is formed over the dielectric layer 126. The dielectric layer 130 may have a high etch selectivity compared to the dielectric layer 126. In some embodiments, the dielectric layer 130 is, for example, a nitride such as silicon nitride ($SiN_x$), a carbide such as silicon carbide (SiC), a carbonitride such as silicon carbonitride (SiCN), an oxynitride such as silicon oxynitride ($SiO_xN_y$), or a suitable dielectric material. The dielectric layer 130 may be formed by using chemical vapor deposition (CVD), plasma enhanced chemical vapor deposition (PECVD), physical vapor deposition (PVD), spin-on process, or any suitable process.

The first dielectric layer 132 is formed over the dielectric layer 130. In some embodiments, the first dielectric layer 132 is made of a polymer material, such as benzocyclobutene (BCB) polymer, polyimide (PI), or polybenzoxazole (PBO). In alternative embodiments, the first dielectric layer 132 includes silicon, silicon nitride ($SiN_x$), silicon oxide ($SiO_x$) such as $SiO_2$, silicon oxynitride ($SiO_xN_y$), or silicon carbide (SiC). In some embodiments, the first dielectric layer 132 is formed by deposition or spin coating. In alternative embodiments, a conductive structure such as a contact pad or a bonding pad may be formed in the first dielectric layer 132.

Referring to FIG. 2A, in some embodiments, the second chip 200 includes a second substrate 202 and a second dielectric layer 232. The second chip 200 is similar to the first chip 100. The second chip 200 includes a second substrate 202 and a second dielectric layer 232. The second substrate 202 is similar to the first substrate 102. The second dielectric layer 232 is similar to the first dielectric layer 132.

In some embodiments, the second chip 200 further includes a device 204, a metallization structure 220 and a dielectric layer 230. The device 204 is similar to the device 104 and includes a gate structure 206 in a dielectric layer 212, source/drain regions 214, and isolation structures 216. The gate structure 206 is similar to the gate structure 106 and includes a gate dielectric layer 208, a gate electrode 210, and spacers (not shown) on the gate electrode 210. The gate dielectric layer 208 is similar to the gate dielectric layer 108, and the gate electrode 210 is similar to the gate electrode 110. In addition, the source/drain regions 214 in the device 204 are similar to the source/drain regions 114, and the isolation structures 216 in the device 204 are similar to the isolation structures 116.

In some embodiments, the metallization structure 220 is similar to the metallization structure 120 and includes a contact plug 222 and a conductive feature 224 in a dielectric layer 226. The contact plug 222 is similar to the contact plug 122, and the dielectric layer 226 is similar to the dielectric layer 126. The conductive feature 224 is similar to the conductive feature 124, and the dielectric layer 226 is similar to the dielectric layer 126. The dielectric layer 230 is similar to the dielectric layer 130.

In some embodiments, the second chip 200 further includes a bonding pad 234 in the second dielectric layer 232. The bonding pad 234 may be electrically connected to the conductive feature 224. The bonding pad 234 includes, for example, a diffusion barrier layer 236 and a conductive layer 238, where the diffusion barrier layer 236 is aside the conductive layer 238. The diffusion barrier layer 236 is used to prevent the conductive material layer 238 from diffusing into other layers, and is made of, for example, silicon nitride (SiN), silicon oxynitride (SiON), titanium nitride (TiN), tantalum nitride (TaN) or aluminum nitride (AlN). In alternative embodiments, the diffusion barrier layer 236 may be bi-layer such as TaN/Ta or TiN/Ti. The conductive layer 238 is made of a conductive material, such as copper (Cu), copper alloy, aluminum (Al), aluminum alloy, or combinations thereof.

Figure 2B:
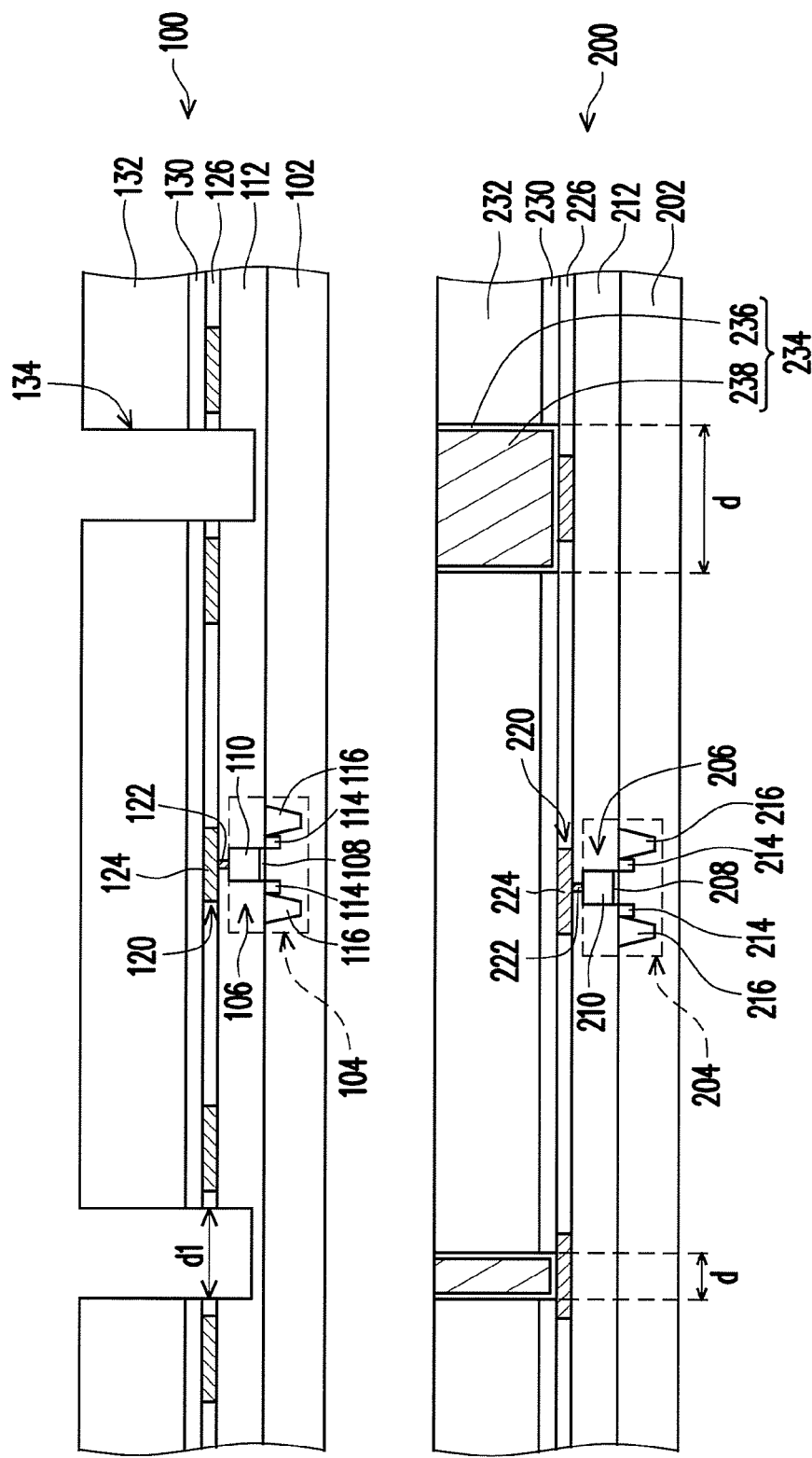

Referring to FIG. 2B, a first opening 134 is formed in the first dielectric layer 132. In some embodiments, a portion of the first dielectric layer 132 is removed by a dry etch process or a wet etch process. In some embodiments, the first opening 134 penetrates through the first dielectric layer 132, and is further extended into the dielectric layer 130, the dielectric layer 126 and the dielectric layer 112 without being extended into the first substrate 102. In alternative embodiments, the first opening 134 may penetrate through first dielectric layer 132 and not be extended into the dielectric layers 130, 126 and 112. In other words, the etch process for the first opening 134 may be performed from a surface of the first dielectric layer 132 to different depth of the first dielectric layer 132, the dielectric layer 130, the dielectric layer 126 or the dielectric layer 112. In some embodiments, a depth of the first opening 134 is about 8-10 um, which depend upon a thickness of the first dielectric layer 132, and a dimension d1 of the first opening 134 may be different from a dimension d of the bonding pad 234.

Figure 2C:
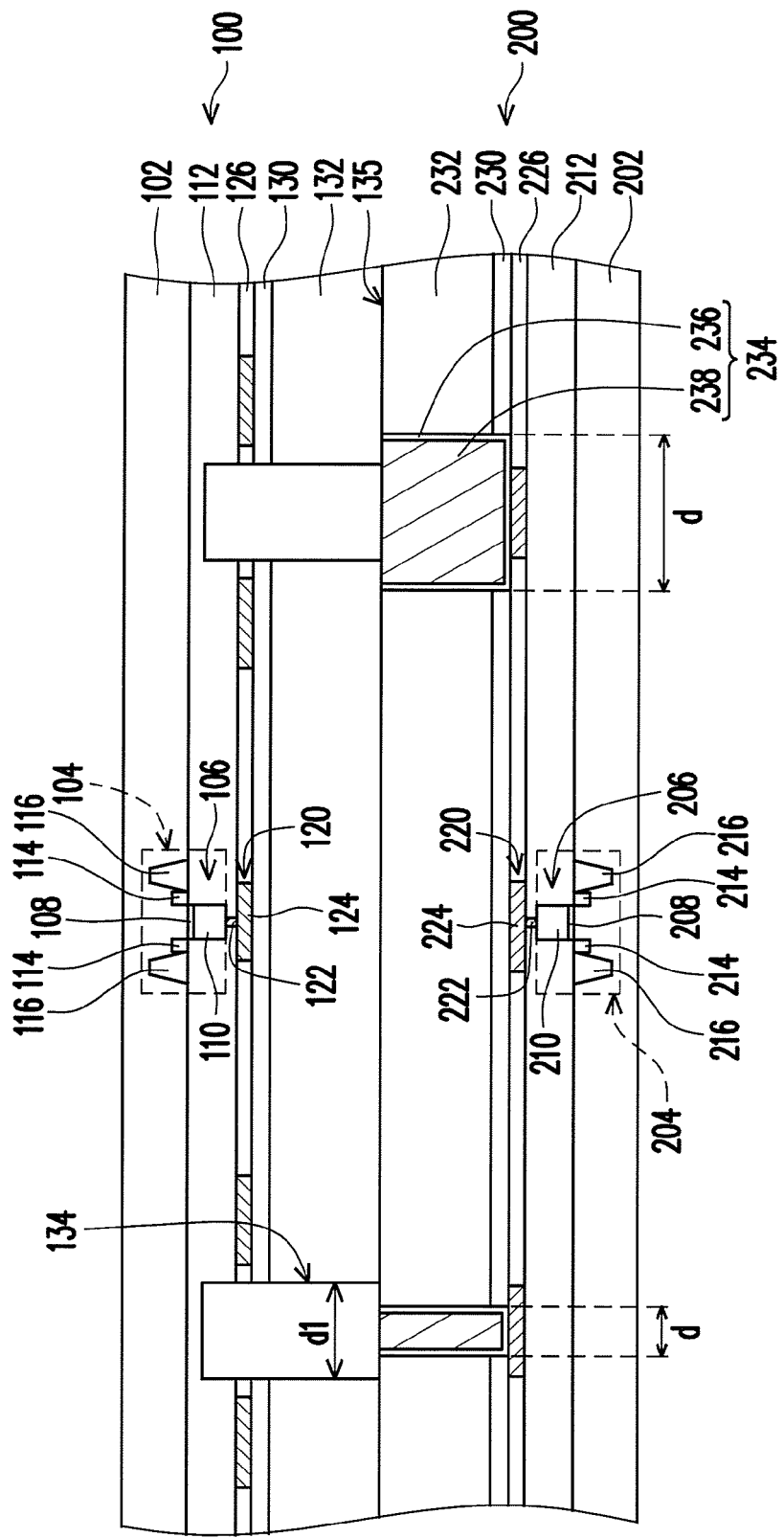

Referring to FIGS. 1 and 2C, in Step S20, the first chip 100 and the second chip 200 are bonded via the first dielectric layer 132 and the second dielectric layer 232, wherein the first opening 134 exposes the bonding pad 234. In some embodiments, the first opening 134 is aligned with the bonding pad 234, and the first opening 134 exposes at least a portion of the bonding pad 234. In some embodiments, the first chip 100 is turned over and the first chip 100 and the second chip 200 are bonded in a face-to-face alignment, where a frontside (e.g., the first dielectric layer 132 side) of the first chip 100 faces a frontside (e.g., the second dielectric layer 232 side) of the second chip 200. The first dielectric layer 132 forms a bonding interface 135 with the second dielectric layer 232 by, for example, a direct surface bonding process, where the first dielectric layer 132 contacts the second dielectric layer 232. In alternative embodiments, the first chip 100 and the second chip 200 are bonded by a hybrid bonding, or any suitable bonding process. The direct surface bonding process creates a bond such as an oxide-to-oxide bond through a cleaning and/or surface activation process followed by applying pressure, heat and/or other bonding process steps to the joined surfaces. Alternatively, the bond can include an adhesive bond using an adhesive such as BCB or polyimide applied to the second chip 200, where the adhesive layer can be formed by using spin on coating or chemical vapor deposition.

Figure 2D:
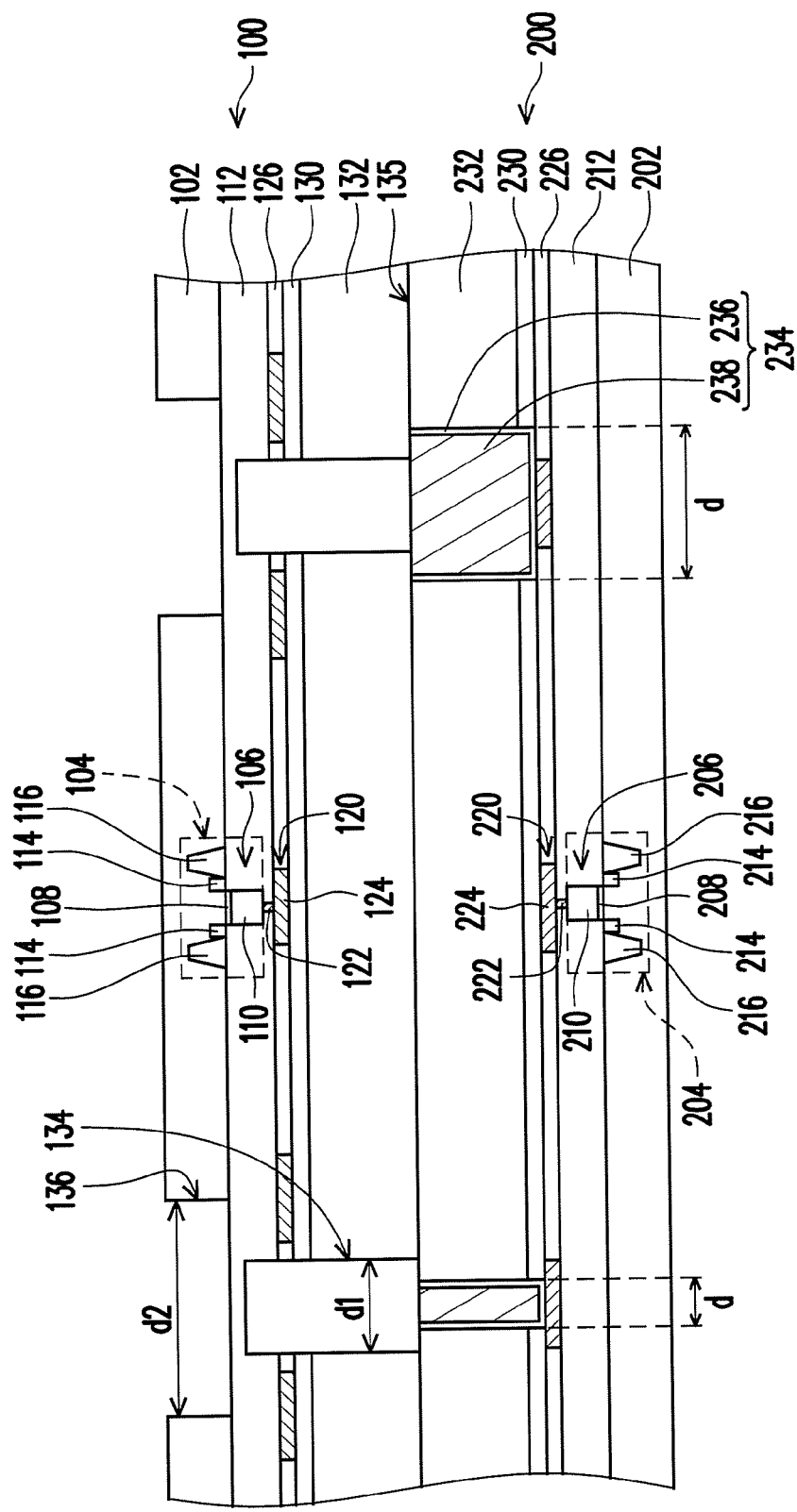
Figure 2E:
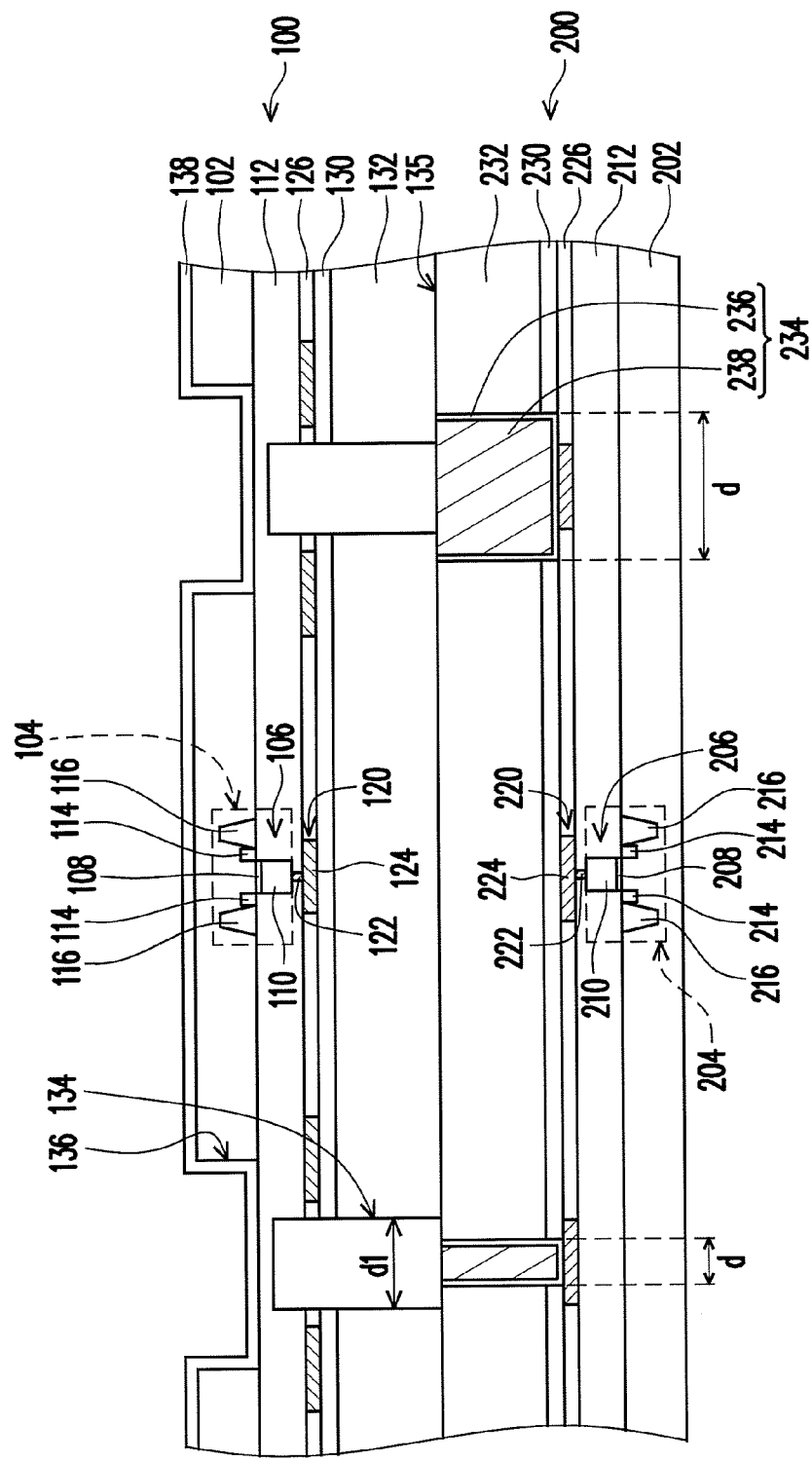
Figure 2F:
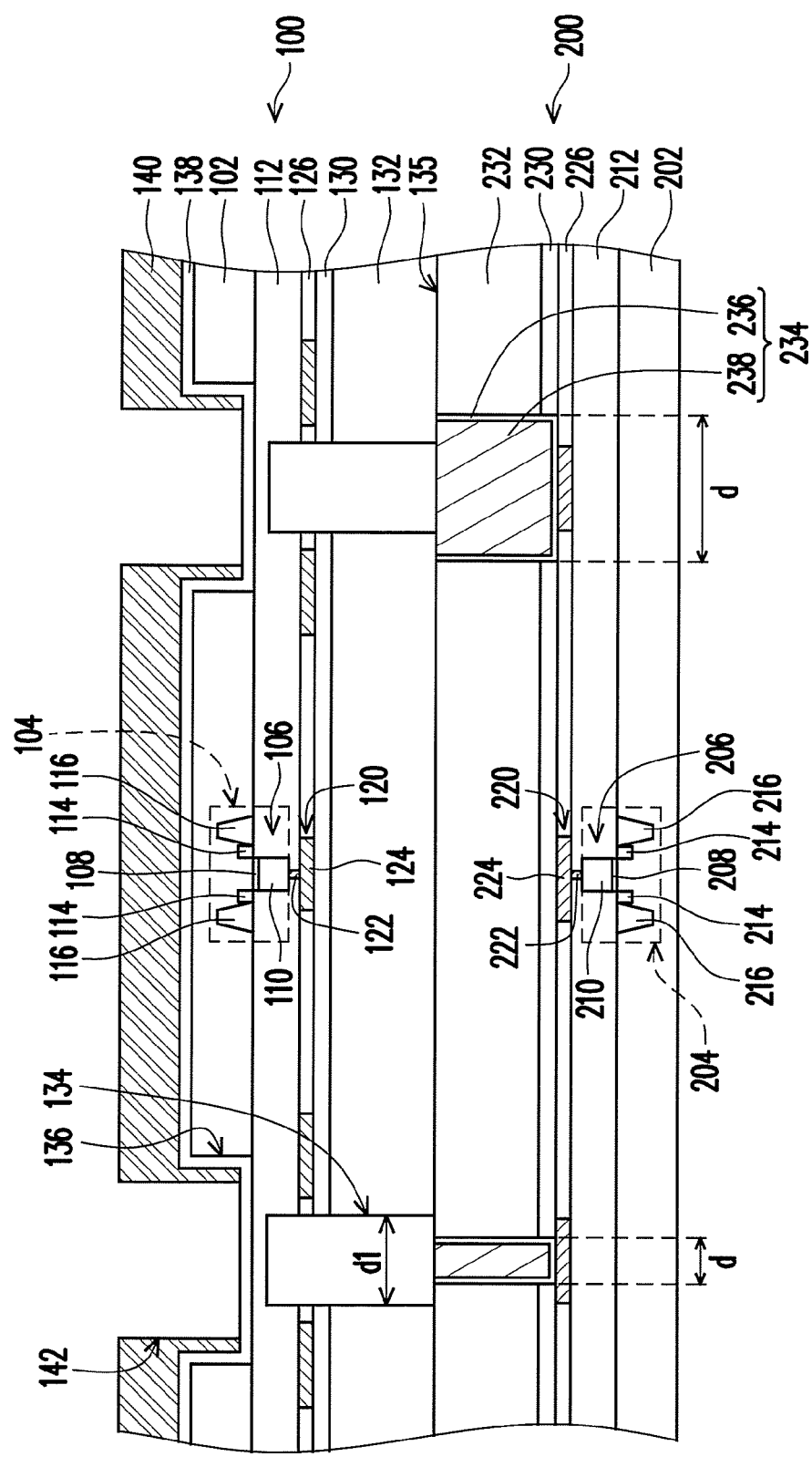
Figure 2G:
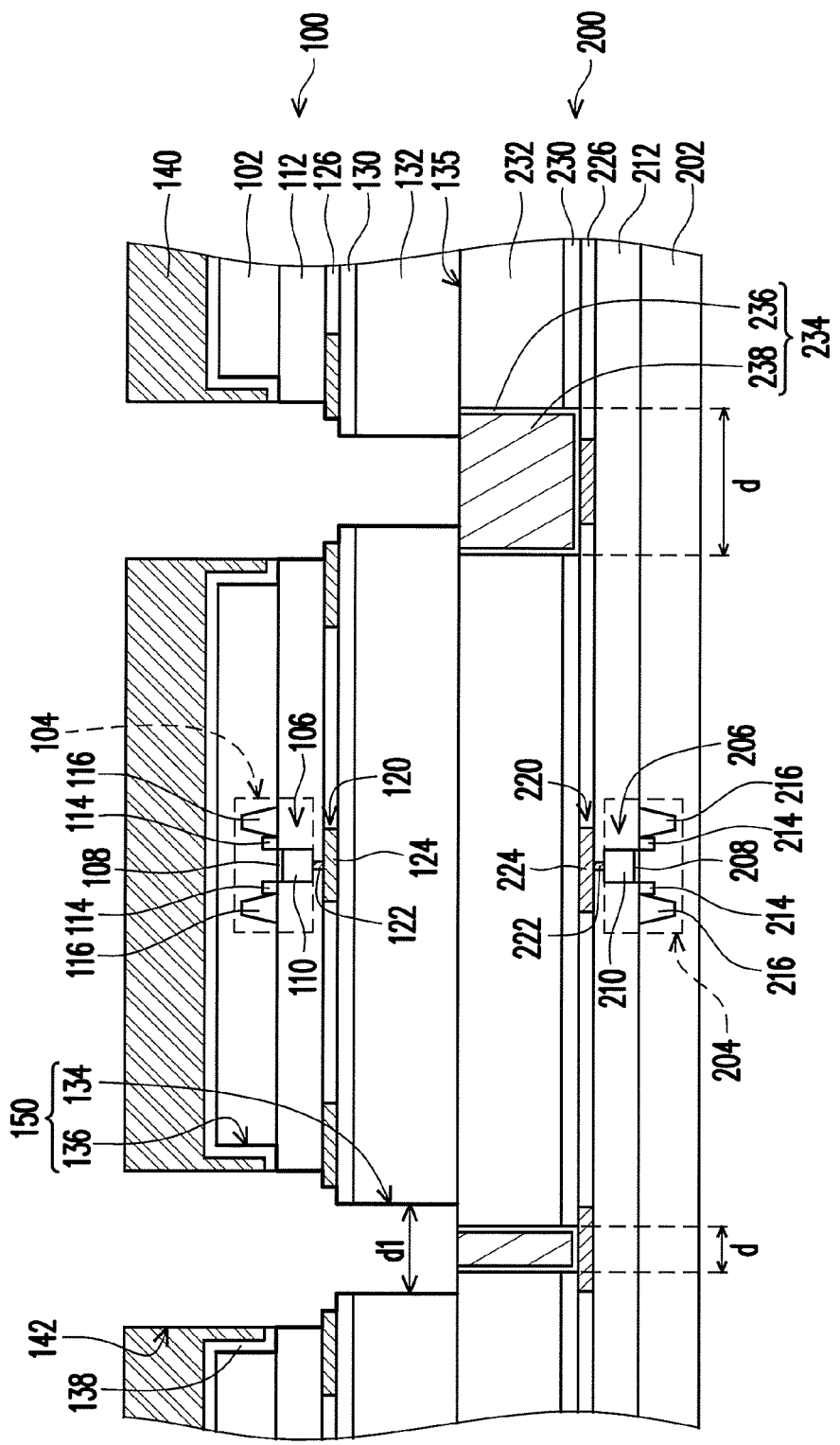
Figure 2H:
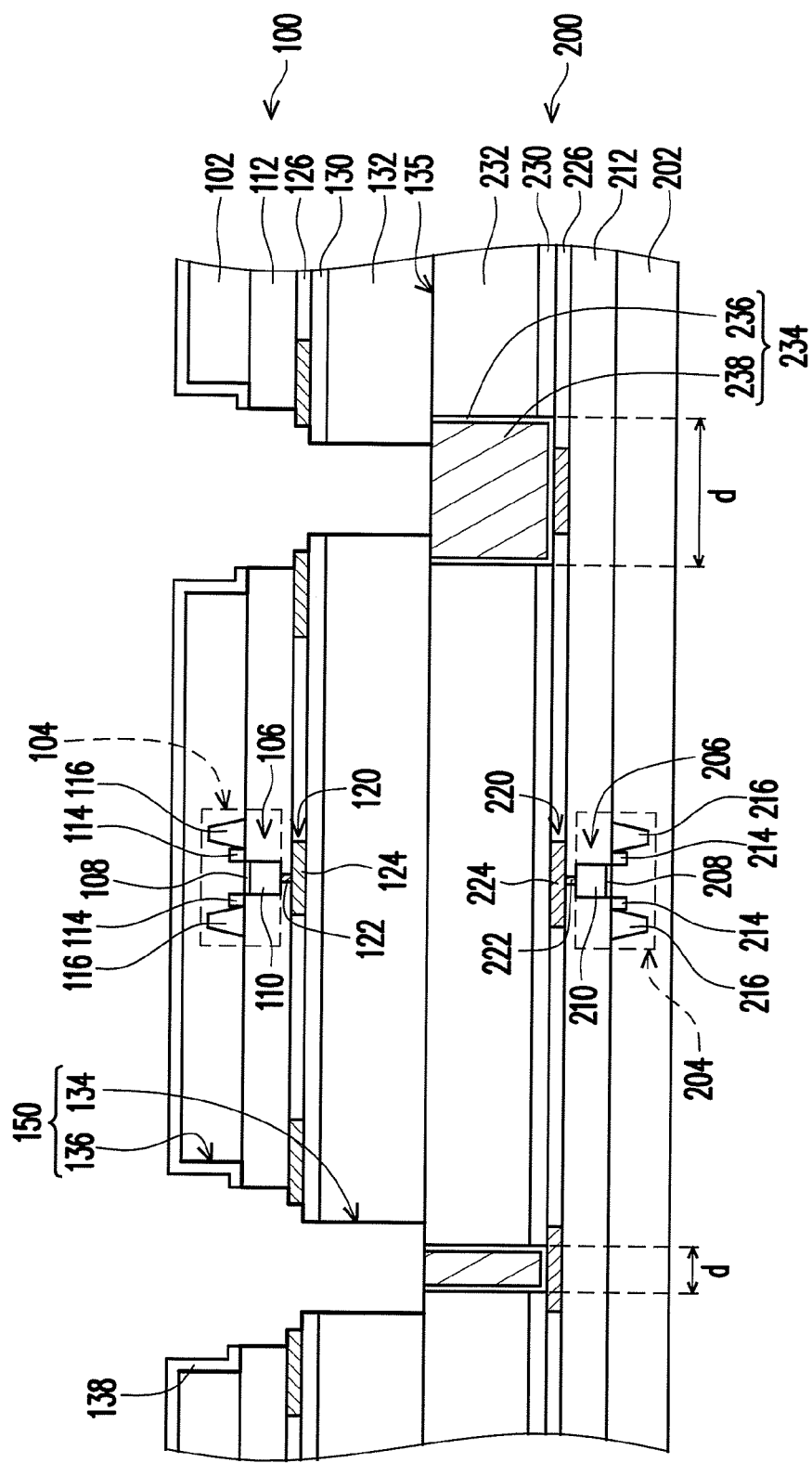
Figure 21:
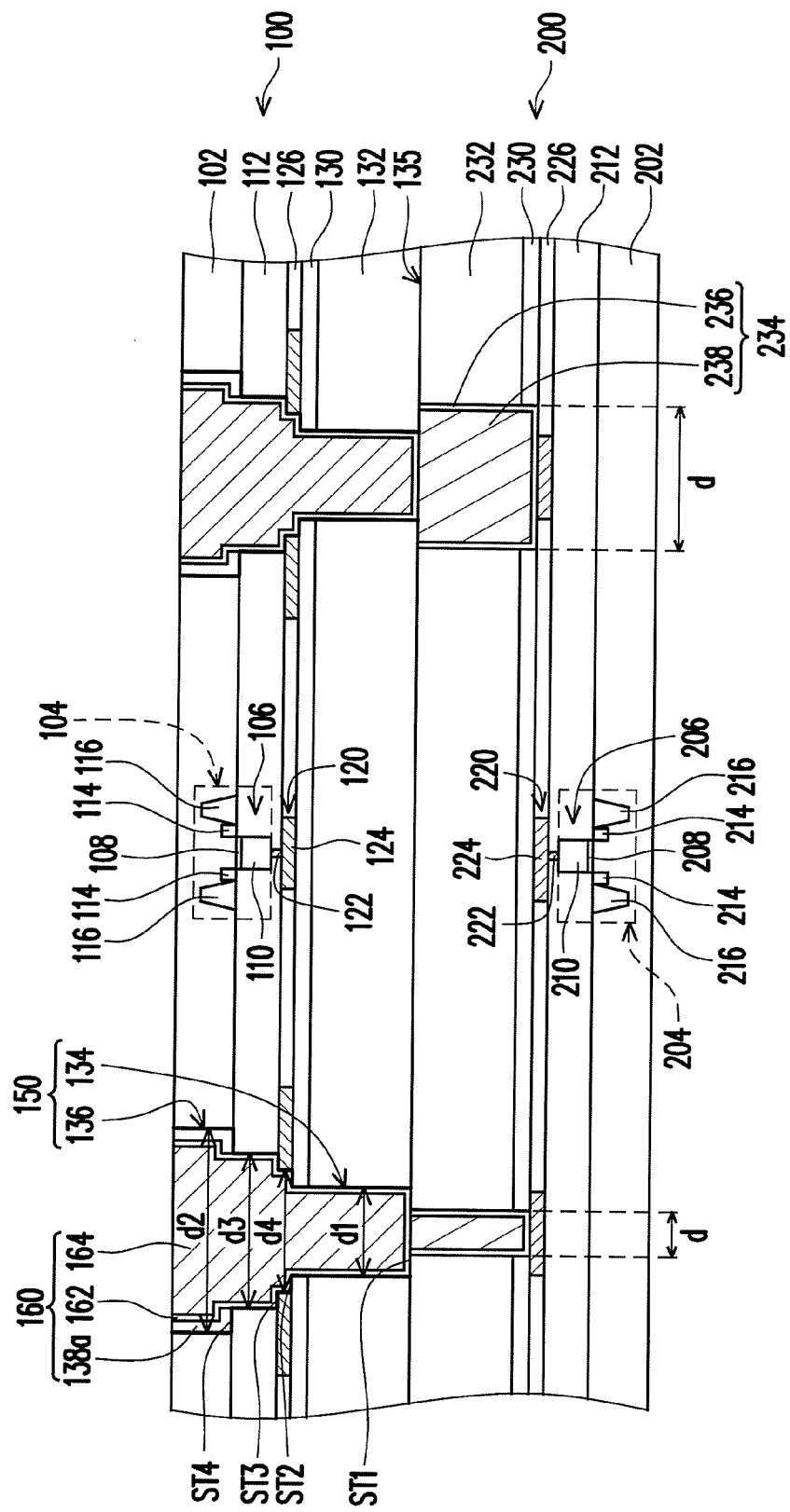

Referring to FIGS. 1 and 2D-2H, in Step S30, a second opening 136 is formed through the first substrate 102, wherein the second opening 136 is connected to the first opening 134 to form a through via opening 150 (which is illustrated by a bold line in FIGS. 2G-2H). In some embodiments, as shown in FIG. 2D, a portion of the first substrate 102 is removed until a portion of the dielectric layer 112 is exposed, and the second opening 136 is formed through the first substrate 102. The portion of the first substrate 102 is removed by a dry etch process or a wet etch process. For example, in a case where the first substrate 102 is silicon, the first substrate 102 may be dry plasma etched with a chlorine based etchant such as gaseous chlorine ($Cl_2$) or wet etched with potassium hydroxide (KOH) or a nitric acid/hydrofluoric acid ($HNO_3$/HF) mix. In some embodiments, a dimension d2 of the second opening 136 is larger than the dimension d1 of the first opening 134. The dimension d2 of the second opening 136 is, for example, smaller than 10 um.

Next, as shown in FIG. 2E, a liner material layer 138 is formed over the first substrate 102 and the exposed portion of the dielectric layer 112. The liner material layer 138 may be conformally deposited over surfaces of the first substrate 102 and a surface of the exposed portion of the dielectric layer 112. In some embodiments, the material of the liner material layer 138 includes silicon oxide ($SiO_x$), silicon nitride ($SiN_x$) or a suitable dielectric material, which may be formed by a deposition process such as PVD, CVD, or PECVD. The liner material layer 138 may be a single layer or multi-layers. In some embodiments, the liner material layer 138 may has a thickness in a range from about 100 Å to about 5000 Å.

In some embodiments, as shown in FIG. 2F, a mask 140 is formed over the liner material layer 138, and is patterned to form an opening 142 exposing a portion of the liner material layer 138 over the first opening 134. The mask 140 is, in some embodiments, a photoresist that is deposited, exposed and developed. The opening 142 in the mask 140 is aligned over the first opening 134.

In some embodiments, as shown in FIG. 2G, by using the mask 140, a portion of the liner material layer 138 and the dielectric layer 112 beneath the portion of the liner material layer 138 are removed to deepen the second opening 136. The portion of the liner material layer 138 and the portion of the dielectric layer 112 are removed by, for example, a dry etch process or a wet etch process. In some embodiments, the material of the dielectric layer 126 is similar to the materials of the dielectric layer 112 and the liner material layer 138, so a portion of the dielectric layer 126 may also be removed by the etch process. In some embodiments, the conductive feature 124 in the dielectric layer 126 and the dielectric layer 130 may act as etch stop layers. Accordingly, the second opening 136 is connected to the first opening 134 to form the through via opening 150, and the through via opening 150 exposes a surface of the bonding pad 234. In some embodiments, the through via opening 150 may further expose a portion of the conductive feature 124 in the dielectric layer 126. The through via opening 150 penetrates through the first chip 100. It is noted that, in alternative embodiments, the conductive feature 124 may not be adjacent to the through via opening, and thus may not be exposed by the through via opening 150.

Then, as shown in FIG. 2H, the mask 140 is removed. In some embodiments, the liner material layer 138 remains on the surfaces of the first substrate 102 after the removal of the mask 140.

Referring to FIGS. 1 and 2I, in Step S40, a through via 160 is formed in the through via opening 150. In some embodiments, the through via 160 includes a liner layer 138a, a diffusion barrier layer 162 and a conductive layer 164, where the diffusion barrier layer 162 is aside the conductive layer 164. The liner layer 138a acts as an isolation layer such that the conductive layer 164 and the first substrate 102 do not directly contact each other. The diffusion barrier layer 162 is used to prevent the conductive layer 164 from diffusing to the devices 104. The through via 160 is, for example, formed by the following operations. Referring back to FIG. 2H, a barrier diffusion material layer (not shown) is conformally formed on the sidewall of the through via opening 150 and over the remained liner material layer 138 disposed on the top surface of the first substrate 102. Then, a conductive material layer (not shown) is formed on the barrier diffusion material layer and fills in the through via opening 150. Afterwards, excess materials extending over the through via opening 150 are simultaneously removed by grinding, chemical mechanical polishing (CMP), polishing, etching or another reduction process. Accordingly, the top surface of the through via 160 is substantially planar with the top surface of the first substrate 102.

In some embodiments, the diffusion barrier layer 162 is made of cobalt (Co), tantalum (Ta), tungsten (W), titanium (Ti), tantalum nitride (TaN), titanium nitride (TiN), cobalt tungsten (CoW), or any suitable conductive material. In alternative embodiments, the diffusion barrier layer 162 includes bi-layer such as TaN/Ta or TiN/Ti. In some embodiments, the diffusion barrier layer 162 is formed by CVD, PVD, PECVD or any suitable process. In some embodiments, the conductive layer 164 is made of copper (Cu), aluminum (Al), aluminum copper alloy (AlCu), gold, titanium, cobalt, an alloy, or any suitable conductive material. The conductive layer 164 is formed by, for example, electrochemical plating (ECP), electroplating, electroless plating or a suitable process.

In some embodiments, the liner material layer 138 is formed before the through via opening 150 is formed.

Therefore, the liner layer 138a is merely formed on an upper portion of the through via opening 150, and the liner layer 138a is between the first substrate 102 and the diffusion barrier layer 162. However, in alternative embodiments, the liner layer (not shown) may be formed after the through via opening 150 is formed, and the liner layer is, for example, formed on a sidewall of the through via opening. Additionally, in alternative embodiments, the second opening 136 connecting the first opening 134 may be formed by simultaneously removing a portion of the first substrate 102, a portion of the dielectric layer 112, and a portion 130 of the dielectric layer 126 in a single etch process.

In some embodiments, the through via 160 is multi-step shaped. That is, rather than having a vertical sidewall and an instant dimension, the through via 160 has multiple steps such as four steps ST1, ST2, ST3 and ST4 and the through via 160 has different dimensions such as four dimensions d1, d2, d3 and d4. In some embodiments, the dimension d2 is larger than the dimension d1 and larger than or equal to the dimension d3, and the dimension d3 is larger than or equal to the dimension d4, and the dimension d4 is larger than or equal to the dimension d1.

Figure 2J:
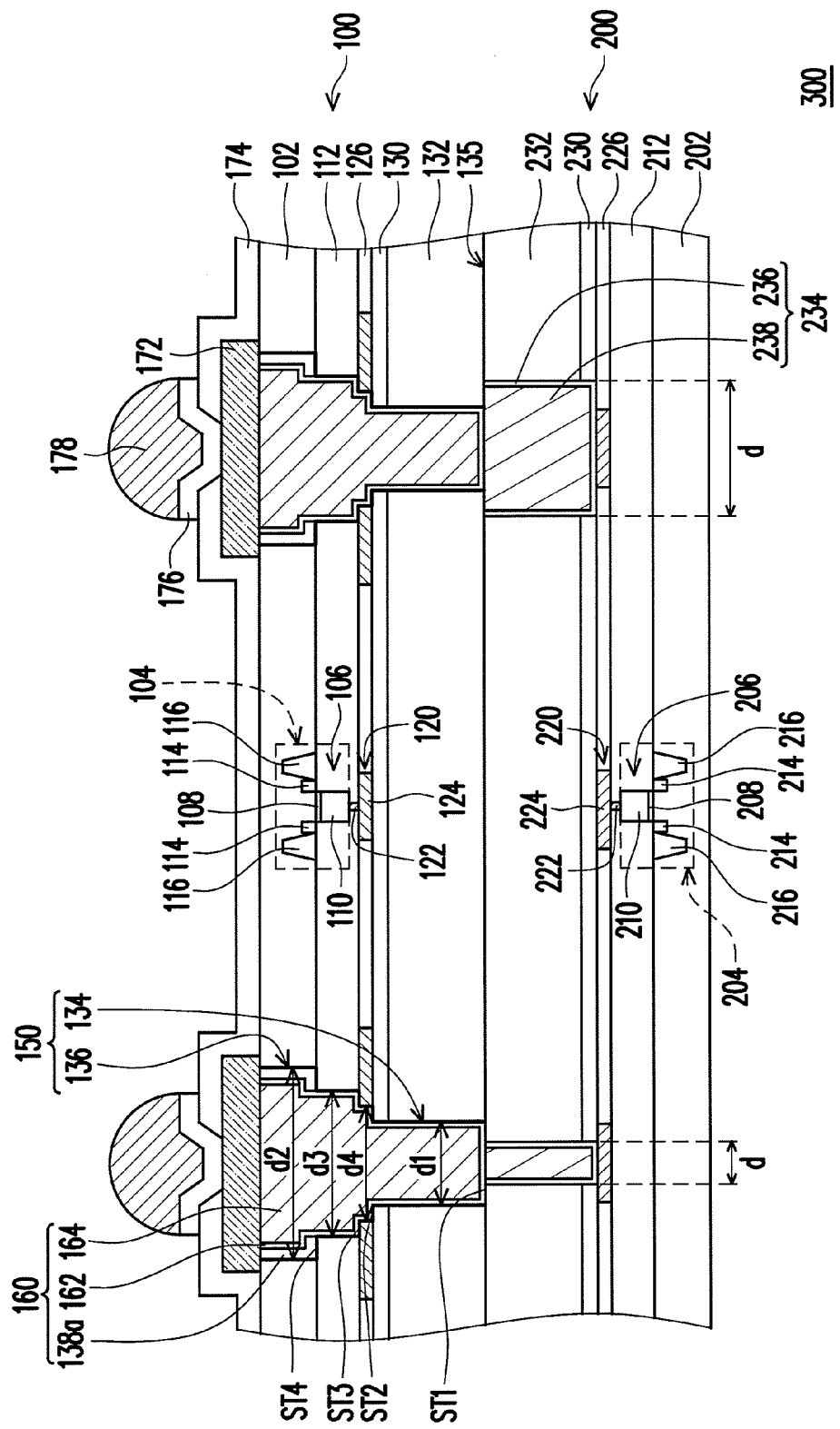

As shown in FIG. 2J, in some embodiments, a conductive element 172 formed in a passivation layer 174 is formed over a surface (backside) of the first chip 100. The conductive element 172 is electrically connected to the through via 160. In some embodiments, the material of the passivation layer 174 is PBO, silicon oxide, polyimide, or any suitable insulating material. In some embodiments, the conductive element 172 is made of a conductive material with low resistivity, such as Cu, Al, Cu alloys, Al alloys, or a suitable material.

In some embodiments, an under bump metallization (UBM) layer 176 is formed over the conductive element 172, and a connector 178 is formed over UBM layer 176. The UBM layer 176 may contain an adhesion layer and/or a wetting layer. In some embodiments, the UBM layer 176 is made of Ti, TiN, TaN, Ta, or the like. In some embodiments, the UBM layer 176 further includes a copper seed layer. In some embodiments, the connector 178 is a solder ball, a pillar, a conductive bump or a suitable conductive connector. The connector 178 is made of a conductive material with low resistivity, such as solder or solder alloy. Exemplary elements included in the solder alloy include Sn, Pb, Ag, Cu, Ni, Bi or combinations thereof. As shown in FIG. 2J, a three dimensional integrated circuit structure 300 is formed. The three dimensional integrated circuit structure 300 may be attached to another substrate, such as a printed circuit board (PCB), a high-density interconnect, a silicon substrate, an organic substrate, a ceramic substrate, a dielectric substrate, a laminate substrate, another semiconductor package structure, or the like through the connector 178. Accordingly, a connection between the second chip 200 and an external device or connection may be formed from the first chip 100 side of the three dimensional integrated circuit structure 300. Similarly, power or data connections may be provided from the first chip 100 or the second chip 200 through the through via 160 to an external device.

In some embodiments, the through via 160 of the first chip 100 penetrates through the first chip 100 to directly contact the bonding pad 234 of the second chip 200 at the bonding interface 135. The through via 160 is disposed on the bonding pad 234 without extending into the second chip 200. The diffusion barrier layer 162 is between the conductive layer 164 and the bonding pad 234 and directly contacts the bonding pad 234 at the bonding interface 135. In some embodiments, the dimension d1 of the through via 160 at the bonding interface 135 is different from the dimension d of the bonding pad 234 at the bonding interface 135. In some embodiments, the dimension d1 of the through via 160 at the bonding interface 135 is larger than or smaller than the dimension d of the bonding pad 234 at the bonding interface 135.

Compared to the through via opening formed by etching from the first substrate and the first dielectric layer to the second dielectric layer of the second chip, the through via opening 150 in some embodiments is formed by sequentially forming the first opening 134 and the second opening 136 and connecting the first opening 134 and the second opening 136. Since a depth-to-width aspect ratio for each of the first opening 134 and the second opening 136 is small, challenge for etching the through via opening is reduced as compared to a through via having a high depth-to-width aspect ratio. Additionally, in a hybrid bonding, the bonding pads of two chips are bonded and thus topography and flatness of the bonding pads are required, and metal oxidation of a surface of the bonding pad such as copper oxidation may occur during bonding. In some embodiments, the through via 160 of the first chip 100 is formed to directly contact the bonding pad 234 of the second chip 200 after bonding the first chip 100 and the second chip 200, and thus the requirements of the topography and flatness of the through via 160 and the bonding pad 234 are lowered and the occurrence of the metal oxidation is prevented. Accordingly, electrical connection between the first chip 100 and the second chip 200 is improved, and the electrical connection and reliability of the three dimensional integrated circuit structure 300 are optimized.

Figure 3A:
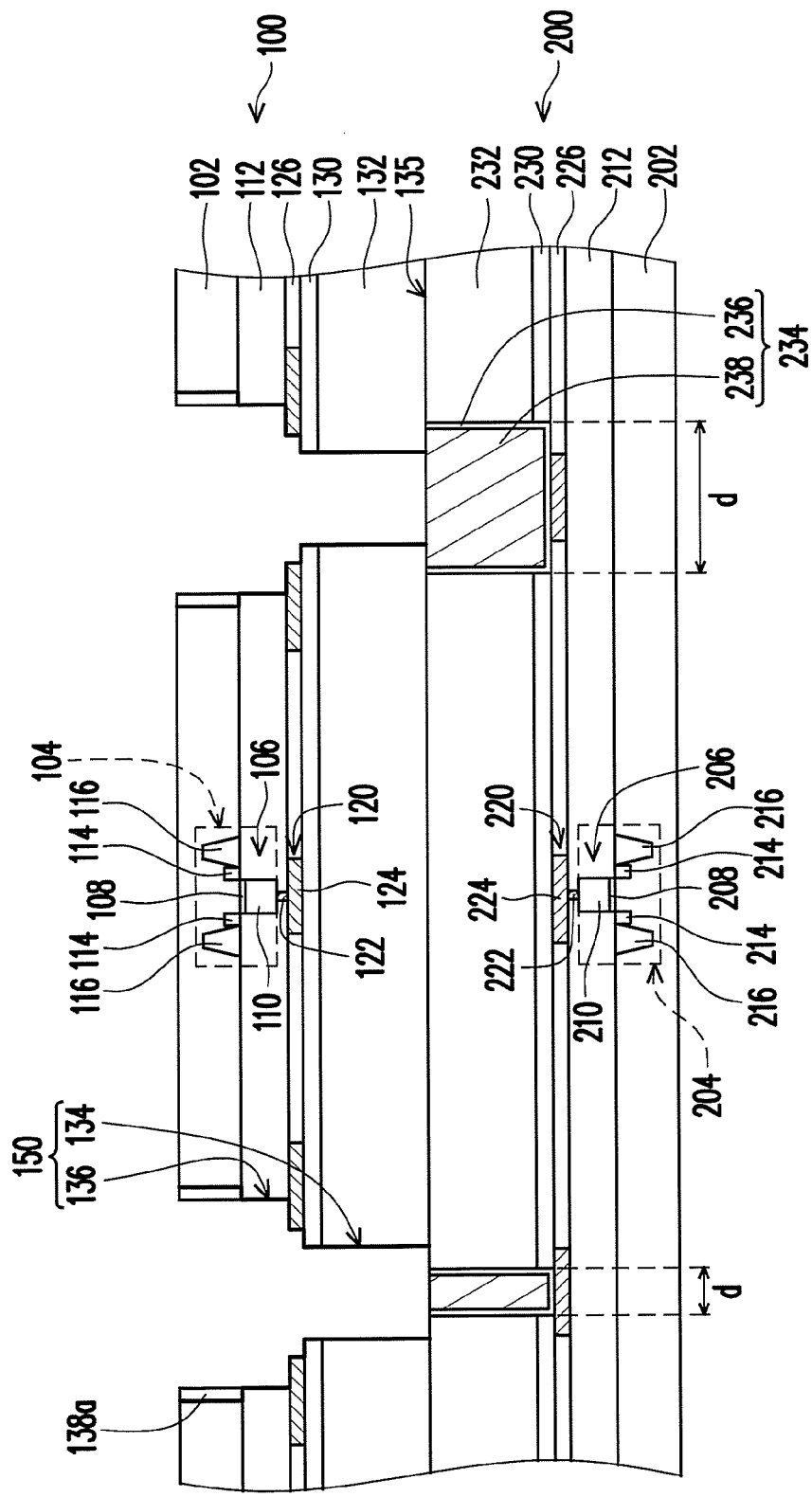
FIG. 3A through FIG. 3C are schematic views showing a manufacturing method of a three dimensional integrated circuit structure in accordance with some embodiments.
Figure 3B:
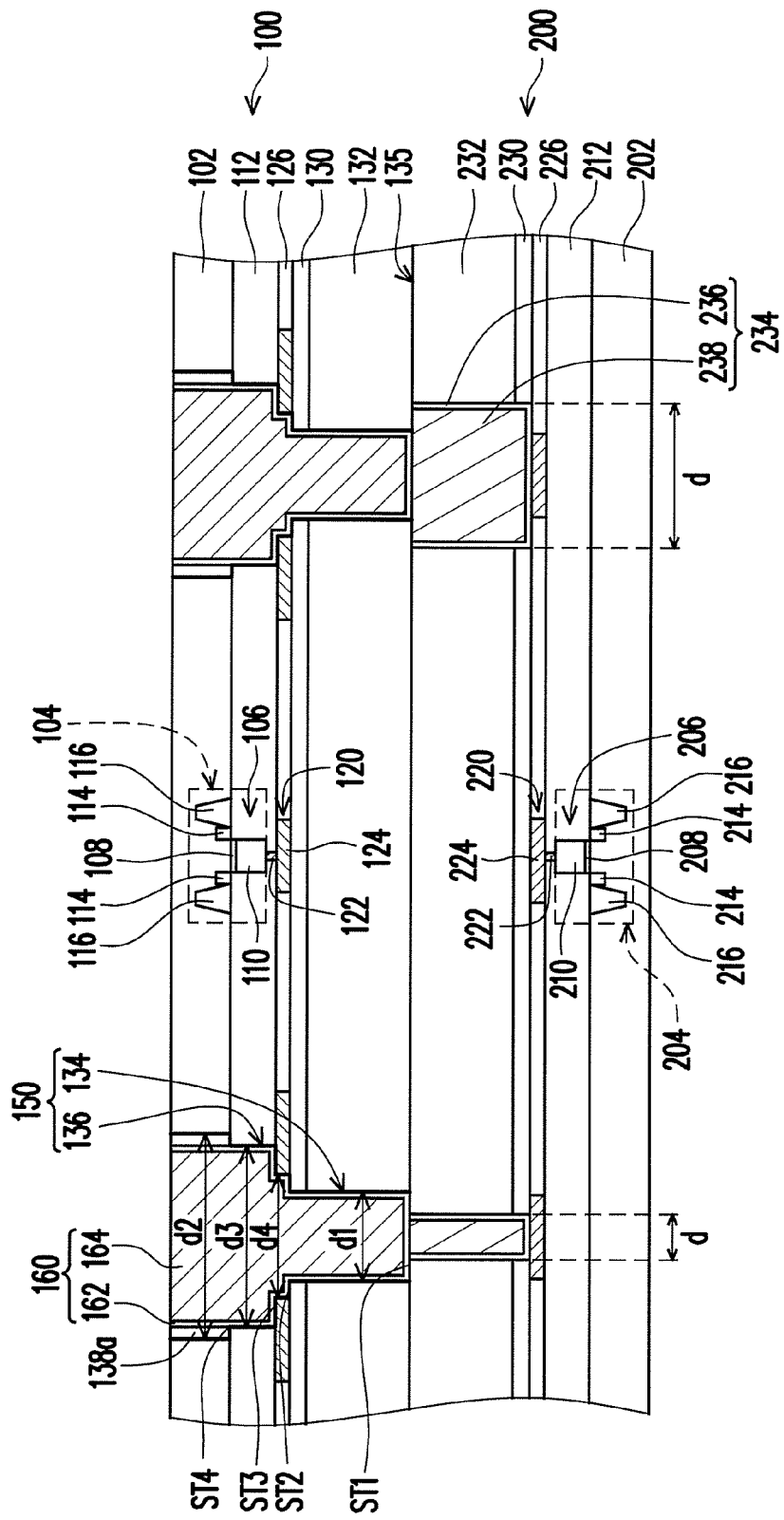
Figure 3C:
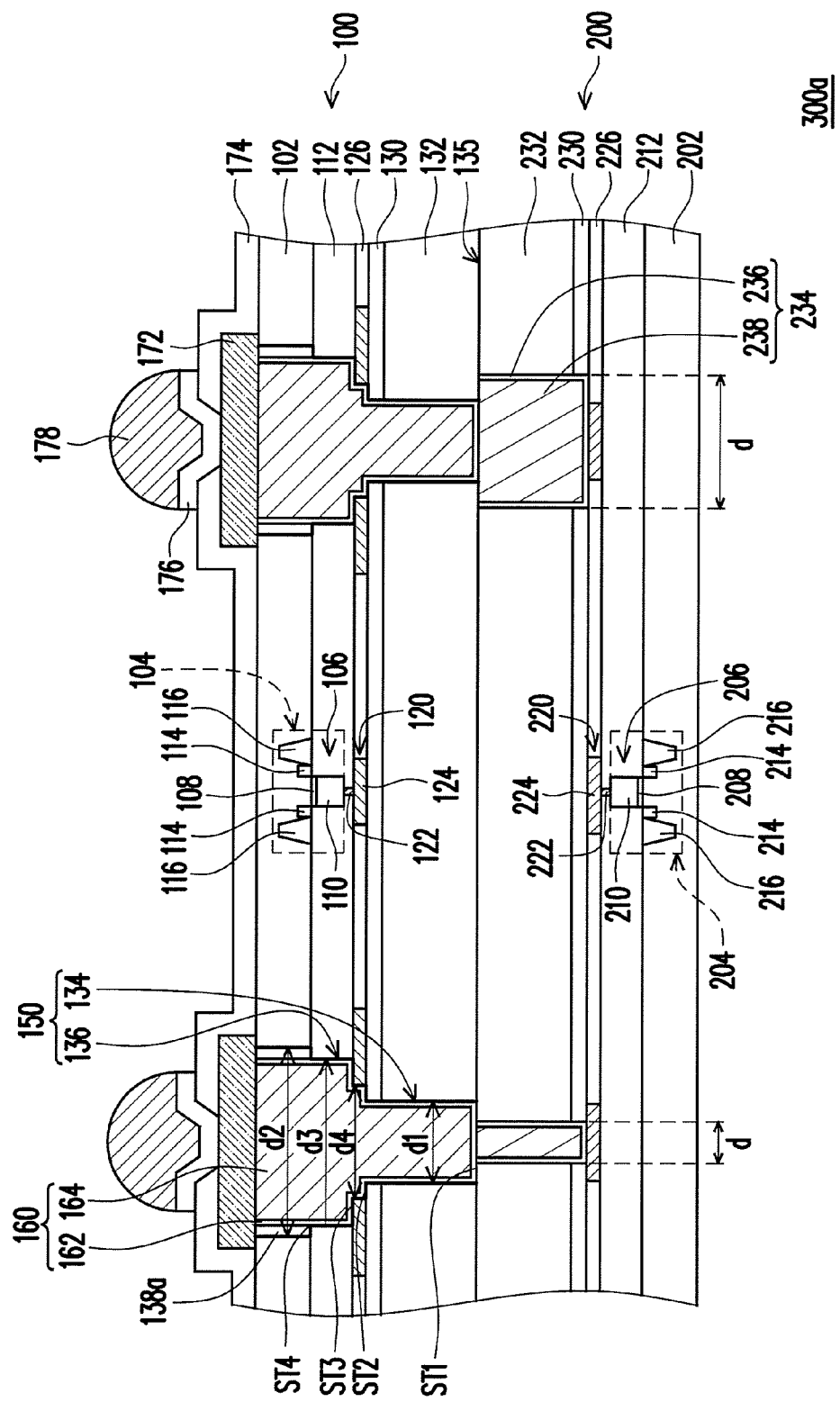

Additionally, the embodiments disclosed above are not limited to the order of steps and structure described above. FIG. 3A through FIG. 3C are schematic views showing a manufacturing method of a three dimensional integrated circuit structure in accordance with some embodiments.

Referring to FIG. 2E and FIG. 3A, as described above, the first chip 100 and the second chip 200 are bonded, and the second opening 136 and the liner material layer 138 are formed. In some embodiments, the liner material layer 138 is etched by using the first substrate 102 as a mask. For example, by an anisotropic etch process such as dry etch process, the liner material layer 138 on the top surface of the first substrate 102 and over the dielectric layers 112 is removed, and the liner material layer 138 on the side surface of the first substrate 102 remains, which is shown in FIG. 3A as a liner layer 138a. Moreover, a portion of the dielectric layers 112 and 126 is also removed during the etch process since the materials of the dielectric layers 112 and 126 and the liner material layer 138 are similar. Thus, the first opening 134 and the second opening 136 are connected to form the through via opening 150.

Referring to FIG. 2E and FIG. 3B, in some embodiments, a through via 160 is formed, for example, by forming a diffusion barrier material layer (not shown) and a conductive material layer (not shown) as described above. Then, excess materials of the diffusion barrier material layer and the conductive material layer extending over the through via opening 150 and over the top surface of the first substrate 102 are removed by grinding, CMP, polishing, etching or another reduction process, so as to form a diffusion barrier layer 162 and a conductive layer 164. In some embodiments, the through via 160 includes the liner layer 138a, a diffusion barrier layer 162 and a conductive layer 164, where the liner layer 138a is the remained liner material layer 138. In some embodiments, the through via 160 is multi-step shaped and has multiple steps such as four steps ST1, ST2, ST3 and ST4, and the through via 160 has different dimensions such as four dimensions d1, d2, d3 and d4.

Referring to FIG. 3C, similar to FIG. 2J, a conductive element 172 formed in a passivation layer 174, an UBM layer 176 and a connector 178 are sequentially formed over the backside of the first substrate 102, for example, as described above. Accordingly, a three dimensional integrated circuit structure 300a is formed and may be attached to another substrate, another semiconductor package structure, or the like through the connector 178.

In some embodiments, the first substrate 102 is used as a mask, and therefore the forming and removing of the mask are omitted. Accordingly, the cost and the time for the manufacturing method of the three dimensional integrated circuit structure 300a may be reduced.

It is noted that, in the said embodiments, although the first and second chips are stacked and boned to form a chip-on-chip configuration, such configuration is not intended to limit the embodiments of the present disclosure in any way. In some embodiments, the stacks may have a chip-on-wafer (COW) bonding configuration or a wafer-to-wafer bonding configuration.

In the above embodiments, the through via opening is formed by forming the first opening in the first dielectric layer before bonding the first and second chips, forming the second opening in the first substrate of the first chip after bonding, and connecting the first opening and the second opening. The through via opening is formed through the first chip without extending into the second chip. Since a depth-to-width aspect ratio for each of the first and second openings is small, challenge for etching the through via opening through the chip is reduced. The through via penetrating through the first chip is disposed on and directly contacts the bonding pad of the second chip at the bonding interface. The diffusion barrier layer is between the conductive layer and the bonding pad and directly contacts the bonding pad at the bonding interface. Since the through via is formed after bonding, the requirements of the topography and flatness of the through via and the bonding pad are lowered and the occurrence of the metal oxidation is prevented. Accordingly, electrical connection between the first chip and the second chip is improved, and the electrical connection and reliability of the three dimensional integrated circuit structure are optimized.

A three dimensional integrated circuit structure includes a first chip and a second chip. The first chip is bonded to the second chip at a bonding interface. A through via of the first chip and a bonding pad of the second chip are electrically connected, and a diffusion barrier layer of the through via contacts the bonding pad at the bonding interface.

A three dimensional integrated circuit structure includes a first chip and a second chip. The first chip is bonded to the second chip at a bonding interface. A through via of the first chip contacts a bonding pad of the second chip at the bonding interface, the through via penetrates through the first chip, and a dimension of the through via at the bonding interface is different from a dimension of the bonding pad at the bonding interface.

A manufacturing method of a three dimensional integrated circuit structure includes the following. A first chip and a second chip are provided, wherein the first chip includes a first substrate and a first dielectric layer having a first opening therein, and the second chip includes a second substrate and a second dielectric layer having a bonding pad therein. The first chip and the second chip are bonded via the first dielectric layer and the second dielectric layer, wherein the first opening exposes the bonding pad. A second opening is formed through the first substrate, wherein the second opening is connected to the first opening to form a through via opening. A through via is formed in the through via opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three dimensional integrated circuit structure, comprising:
    a first chip bonded to a second chip at a bonding interface, wherein a through via of the first chip and a bonding pad of the second chip are electrically connected, and a diffusion barrier layer of the through via contacts the bonding pad at the bonding interface, wherein the through via is multi-step shaped.

2. The three dimensional integrated circuit structure according to claim 1, wherein the through via comprises a conductive layer and the diffusion barrier layer aside the conductive layer and between the conductive layer and the bonding pad.

3. The three dimensional integrated circuit structure according to claim 2, wherein the through via further comprises a liner layer, and the diffusion barrier layer is between the liner layer and the conductive layer.

4. The three dimensional integrated circuit structure according to claim 1, wherein the through via penetrates through the first chip.

5. The three dimensional integrated circuit structure according to claim 1, wherein the through via penetrates through a first substrate and a first dielectric layer of the first chip, the bonding pad is in a second dielectric layer of the second chip, and the first dielectric layer is bonded to the second dielectric layer.

6. The three dimensional integrated circuit structure according to claim 5, wherein the through via comprises a conductive layer, the diffusion barrier layer aside the conductive layer and between the conductive layer and the bonding pad, and a liner layer between the first substrate and the diffusion barrier layer.

7. A three dimensional integrated circuit structure, comprising:
    a first chip bonded to a second chip at a bonding interface, wherein a through via of the first chip contacts a bonding pad of the second chip at the bonding interface, the through via penetrates through the first chip, and a dimension of the through via at the bonding interface is different from a dimension of the bonding pad at the bonding interface, wherein the dimension of the through via at the bonding interface is larger than the dimension of the bonding pad at the bonding interface.

8. The three dimensional integrated circuit structure according to claim 7, wherein the through via comprises a conductive layer and a diffusion barrier layer aside the conductive layer and between the conductive layer and the bonding pad, and the diffusion barrier layer contacts the bonding pad at the bonding interface.

9. The three dimensional integrated circuit structure according to claim 8, wherein the through via further comprises a liner layer, and the diffusion barrier layer is between the liner layer and the conductive layer.

10. The three dimensional integrated circuit structure according to claim 7, wherein the through via penetrates through a first substrate and a first dielectric layer of the first chip, the bonding pad is in a second dielectric layer of the second chip, and the first dielectric layer is bonded to the second dielectric layer.

11. The three dimensional integrated circuit structure according to claim 10, wherein the through via comprises a conductive layer, the diffusion barrier layer aside the conductive layer and between the conductive layer and the bonding pad, and a liner layer between the first substrate and the diffusion barrier layer.

12. A manufacturing method of a three dimensional integrated circuit structure, the manufacturing method comprising:
    providing a first chip and a second chip, wherein the first chip comprises a first substrate and a first dielectric layer having a first opening therein, and the second chip comprises a second substrate and a second dielectric layer having a bonding pad therein;
    bonding the first chip and the second chip via the first dielectric layer and the second dielectric layer, wherein the first opening exposes the bonding pad;
    after forming the first opening, forming a second opening in the first substrate, wherein the second opening is not connected to the first opening;
    after forming the second opening, connecting the first opening and second opening to form a through via opening; and
    forming a through via in the through via opening.

13. The manufacturing method of the three dimensional integrated circuit structure according to claim 12, wherein the first chip further comprises a third dielectric layer between the first substrate and the first dielectric layer, and the first opening is further extended into the third dielectric layer.

14. The manufacturing method of the three dimensional integrated circuit structure according to claim 13, wherein the step of forming the second opening comprises removing a portion of the third dielectric layer.

15. The manufacturing method of the three dimensional integrated circuit structure according to claim 13, wherein the step of forming the second opening comprises:
    removing a portion of the first substrate until a portion of the third dielectric layer is exposed;
    forming a liner material layer over the first substrate and the exposed portion of the third dielectric layer; and
    removing a portion of the liner material layer and another portion of the third dielectric layer to form the second opening.

16. The manufacturing method of the three dimensional integrated circuit structure according to claim 15, wherein the step of removing the portion of the liner material layer and another portion of the third dielectric layer comprises etching the liner material layer and the third dielectric layer by using the first substrate as a mask.

17. The manufacturing method of the three dimensional integrated circuit structure according to claim 13, wherein a dimension of the second opening is different from a dimension of the first opening.

18. The manufacturing method of the three dimensional integrated circuit structure according to claim 12, wherein before forming the second opening, a portion of the first dielectric layer is disposed between the first substrate and the first opening.

\* \* \* \* \*